(12) United States Patent
Siozios et al.

(10) Patent No.: US 11,090,826 B2
(45) Date of Patent: Aug. 17, 2021

(54) RAZOR BLADE

(71) Applicant: BIC-VIOLEX SA, Attiki (GR)

(72) Inventors: Anastasios Siozios, Athens (GR); Konstantinos Mavroeidis, Papagos Athens (GR); Labros Kontokostas, Athens (GR); Ioannis Papatriantafyllou, Athens (GR); Taxiarchis Terlilis, Athens (GR)

(73) Assignee: BIC VIOLEX SA, Anixi (GR)

( * ) Notice: Subject to any disclaimer, the term of this patent is extended or adjusted under 35 U.S.C. 154(b) by 263 days.

(21) Appl. No.: 15/420,814

(22) Filed: Jan. 31, 2017

(65) Prior Publication Data
US 2017/0136641 A1 May 18, 2017

Related U.S. Application Data

(63) Continuation-in-part of application No. PCT/EP2015/067477, filed on Jul. 30, 2015, and a continuation-in-part of application No. PCT/EP2014/079091, filed on Dec. 22, 2014, and a
(Continued)

(51) Int. Cl.
| | |
|---|---|
| B26B 21/60 | (2006.01) |
| B26B 21/22 | (2006.01) |
| C23C 14/02 | (2006.01) |
| C23C 14/14 | (2006.01) |
| C23C 14/06 | (2006.01) |
| B26B 21/40 | (2006.01) |
| C23C 14/34 | (2006.01) |

(52) U.S. Cl.
CPC .............. *B26B 21/60* (2013.01); *B26B 21/22* (2013.01); *B26B 21/4068* (2013.01); *C23C 14/021* (2013.01); *C23C 14/067* (2013.01); *C23C 14/14* (2013.01); *C23C 14/3464* (2013.01)

(58) Field of Classification Search
CPC ..... B26B 21/30; B26B 21/4068; B26B 21/22; B26B 21/56; B26B 21/58; B26B 21/00; C23C 14/3464; C23C 14/14; C23C 14/021
USPC ........... 30/346.54, 526, 346.53, 345, 32, 50, 30/346.55, 350, 357
See application file for complete search history.

(56) References Cited

U.S. PATENT DOCUMENTS

| | | | | |
|---|---|---|---|---|
| 3,835,537 A | * | 9/1974 | Sastri | B26B 21/54 30/346.53 |
| 4,720,918 A | * | 1/1988 | Curry | B26B 21/58 30/346.5 |

(Continued)

*Primary Examiner* — Ghassem Alie
(74) *Attorney, Agent, or Firm* — Polsinelli PC

(57) ABSTRACT

A razor blade comprising a blade substrate with a blade edge substrate portion ending in blade tip. The razor blade is covered by a strengthening coating deposited on the blade edge substrate portion via a deposition process. The deposition process causes a hardness value of the strengthening coating layer to be increased, which, among other factors, allows for a decreased thickness of the blade substrate with coating. The blade substrate with coating has (i) a thickness of between about 1.57 and 2.37 micrometers measured at a distance of about five micrometers from the coating tip, (ii) a thickness of between about 4.62 and 6.74 micrometers measured at a distance of about twenty micrometers from the coating tip, and (iii) a thickness of between about 19.82 and 27.52 micrometers measured at a distance of about one hundred micrometers from the coating tip.

23 Claims, 10 Drawing Sheets

Related U.S. Application Data continuation-in-part of application No. PCT/EP2014/066511, filed on Jul. 31, 2014.

(56) References Cited

U.S. PATENT DOCUMENTS

| | | | | |
|---|---|---|---|---|
| 6,962,000 B2* | 11/2005 | Teeuw | ............... | B26B 21/56 30/346.5 |
| 2010/0011590 A1* | 1/2010 | DePuydt | ............. | B26B 21/00 30/50 |
| 2013/0014395 A1* | 1/2013 | Patel | .................. | B26B 21/60 30/346.54 |
| 2013/0031794 A1* | 2/2013 | Duff, Jr. | ............. | B26B 21/60 30/526 |

* cited by examiner

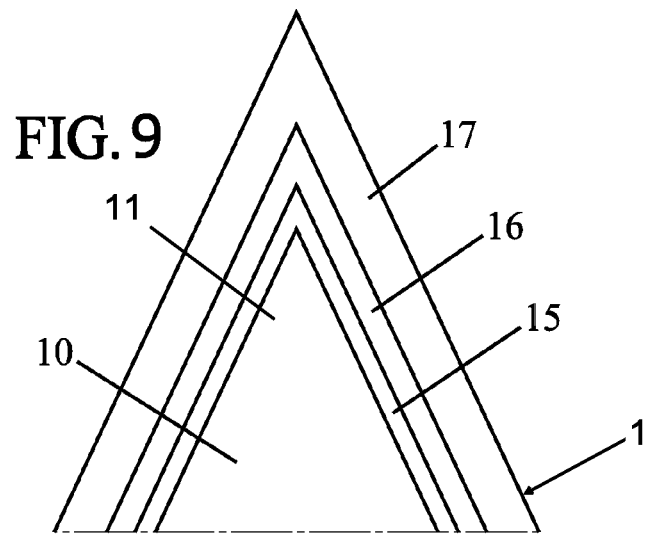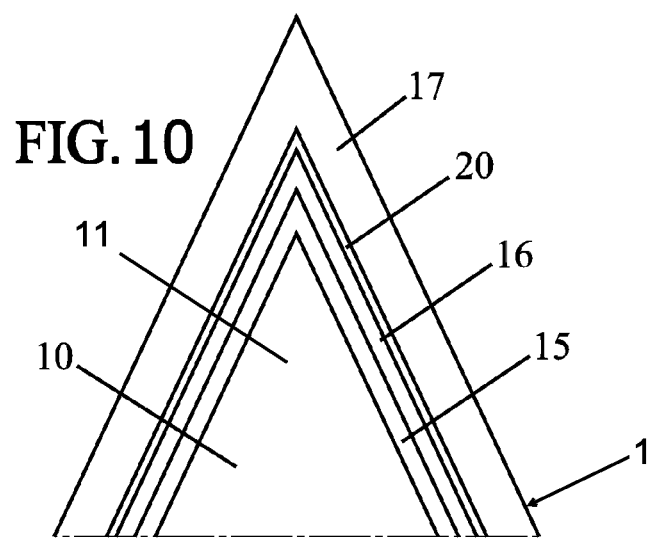

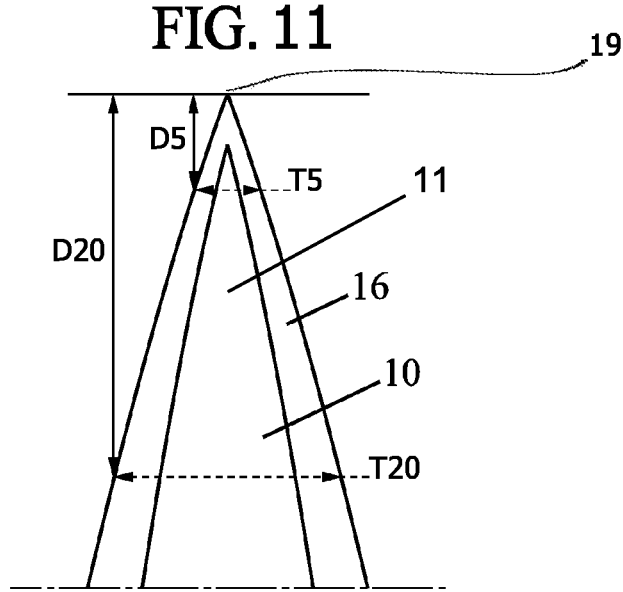
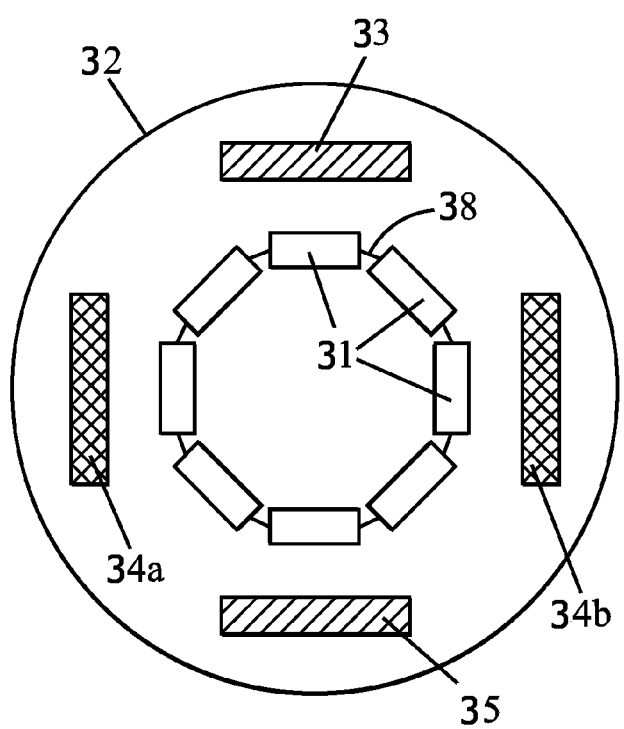
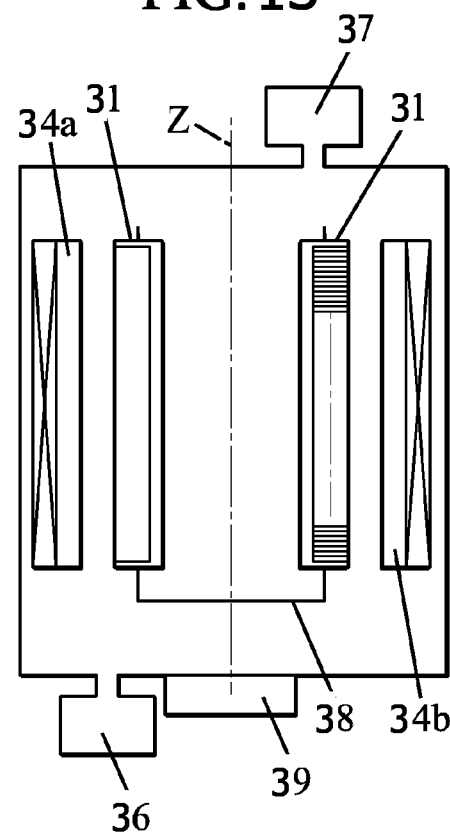

RAZOR BLADE

CROSS-REFERENCE TO RELATED APPLICATIONS

This Patent Application claims priority to and is a continuation in part of PCT/EP2015/067477 filed Jul. 30, 2015; PCT/EP2014/079091 filed Dec. 22, 2014 and PCT/EP2014/066511 filed Jul. 31, 2014; the entire contents of which are herein incorporated by reference in their entireties.

BACKGROUND OF THE INVENTION

1. Field of the Invention

The present inventive concept relates to razor blades and more particularly to razor blade edges and razor blade coatings.

2. Description of the Related Art

From the prior art, razor blades have been provided. Suitably placed in a razor cartridge, they offer the ultimate function of cutting hair or shaving. A shape of the razor blade and a coating of the razor blade play an important role in the quality of the shaving.

Regarding shape, razor blades typically have a continuously tapering shape converging toward an ultimate tip. The portion of the razor blade which is closest to the ultimate tip is called the blade tip or blade edge. If the blade tip is robust, it will enable less wear and a longer service life, but it would result in larger cutting forces, which adversely affect the shaving comfort. A thin blade tip profile leads to less cutting forces, but also to an increase in risk of breakage or damage, and a shorter service life. Therefore, a cutting edge of a razor blade for which an optimal trade-off between the cutting forces, the shaving comfort, and the service life is desired.

Regarding coatings, razor blades have been provided with a substrate and a coating covering the substrate. The coatings generally provide enhanced strength to the razor blade edge, which in turn enhances life expectancy. Providing a better coating on a razor blade edge is a challenge for a number of reasons. First, because the razor blade substrate edge has a very peculiar geometry, depositing a coating on it which would operate as a suitable coating by enhancing the cutting properties and strengthening the razor blade edge is very difficult. Second, razor blades are a mass consumption good, so the coatings must be uniformly applied from product to product, and at a high throughput, which requires a coating compatible with a very reliable process. Third, even if it were possible to deposit a new coating on a razor blade, measuring the improvement with respect to conventional razor blades is also very difficult. This difficulty is because the perceived quality of shaving by test panels can be very subjective. Nonetheless, improving razor blades by providing a better razor blade coating is desired.

SUMMARY OF THE INVENTION

The present inventive concept provides a shaving razor that satisfies the aforementioned desires in view of conventional shaving razors. The shaving razor of the present inventive concept generally includes a blade substrate with a blade edge substrate portion ending in blade tip. At least the blade edge substrate portion is covered by a coating including a strengthening coating layer deposited on the blade edge substrate portion via a physical vapor deposition process. A number of physical properties of the strengthening coating layer are achieved and/or enhanced through the deposition process. For instance, the deposition process causes a hardness value of the strengthening coating layer to be increased by altering a configuration of the strengthening coating layer. The increased hardness value of the strengthening coating layer, among other factors, allows for a decreased thickness of the blade substrate with coating. The blade substrate with coating has a thickness of between 1.57 and 2.37 micrometers (μm) measured at a distance of five μm from the coating tip, a thickness of between 4.62 and 6.74 μm measured at a distance of twenty μm from the coating tip, a thickness of between 19.82 and 27.52 μm measured at a distance of one hundred μm from the coating tip. The altered configuration of the strengthening coating layer is a featureless structure with small crystallites between 2 and 15 nanometers (nm) and a density of >4.15 g/cm³, which provides increased strength and durability for the blade edge substrate portion.

The aforementioned may be achieved in one aspect of the present inventive concept by providing a razor blade substrate. The razor blade substrate may have an edge portion. The edge portion may have two substrate sides converging toward a substrate tip. The razor blade substrate may have a coating formed on the edge portion. The coating may include a strengthening coating layer. The coating may define a coating tip.

A first thickness of the edge portion with the coating measured at a first distance of five micrometers from the coating tip may be between 1.57 and 2.37 micrometers. A second thickness of the edge portion with the coating measured at a second distance of twenty micrometers from the coating tip may be between 4.62 and 6.74 micrometers. A third thickness of the edge portion with the coating measured at a third distance of hundred micrometers from the coating tip may be between 19.82 and 27.52 micrometers.

The strengthening coating layer may be made of a mixture of titanium and boron. At least one area may have a concentration of titanium or boron that is different than another concentration of titanium or boron in another area. The strengthening coating layer may be made of a mixture of titanium and boron, with an average proportion of boron atoms and titanium atoms between 1.3:1 and 2.3:1. The strengthening coating layer may include one or more titanium diboride (TiB2) areas. The strengthening coating may include a strengthening nanocrystalline arrangement or nanocrystalline layer made of a mixture of titanium and/or boron, with at least (i) one or more titanium-rich areas, and (ii) one or more boron-rich areas, where "rich" is used by reference to a stoichiometric TiB2 composition.

The strengthening coating layer may include one or more featureless crystallites having a characteristic dimension between 2 and 15 nanometers. The strengthening coating layer may be deposited under a condition which, when applied to deposition on a sample, causes the strengthening coating layer to have a density above 3.9 grams per cubic centimeter. The condition may be the deposition process of the present inventive concept.

The razor blade substrate may be made of stainless steel. The coating may include an interlayer between the razor blade substrate and the strengthening coating layer. The interlayer may be made of titanium or chromium. The coating may include a metal-containing overcoat layer over the strengthening coating layer. The overcoat layer may be made of chromium or titanium. The coating may only include the strengthening coating layer without any other layers. The coating may only include the strengthening coating layer without any other layers. In other words, the strengthening coating layer may be the sole layer in the coating.

A thickness of the strengthening coating layer, measured normal to a side of the razor blade substrate may be between 20 and 400 nanometers. The coating may include a polymer coating on the strengthening coating layer. The strengthening layer may include a plurality of areas with different proportions of titanium atoms and boron atoms. The strengthening layer may include a first area of the plurality of areas with a proportion of boron atoms and titanium atoms between y:1 and z:1, wherein y and z are between 1.3 and 1.99, and y is lower than z. The strengthening layer may include a first area of the plurality of areas with a proportion of boron atoms and titanium atoms in at least one of the plurality of areas is between u:1 and v:1, wherein u and v are between 2.01 and 2.3 and u is lower than v.

A fourth thickness of the edge portion at a fourth distance of thirty micrometers from the blade tip without the coating may be between 6.52 and 9.34 micrometers. A fifth thickness of the edge portion without the coating at a fifth distance of forty micrometers from the blade tip may be between 8.42 and 11.94 micrometers. A sixth thickness of the edge portion without the coating at a sixth distance of fifty micrometers from the blade tip may be between 10.32 and 14.53 micrometers.

The aforementioned may be achieved in another aspect of the present inventive concept by providing a razor head having a cartridge with the razor blade. The aforementioned may be achieved in another aspect of the present inventive concept by providing a razor having a handle secured to the razor head.

The aforementioned may be achieved in another aspect of the present inventive concept by providing a method of manufacturing a razor blade. The method may include the step of forming a razor blade substrate having an edge portion, i.e., a blade edge substrate portion. The edge portion may include two substrate sides converging toward a substrate tip or blade tip. The method may include the step of applying a pulsed DC bias to the razor blade substrate and/or the step of depositing a coating over the edge portion. The coating may include a strengthening coating layer. It is foreseen that a DC bias voltage could be applied to the razor blade substrate instead of the pulsed DC bias voltage without deviating from the scope of the present inventive concept.

At least a portion of the coating may be formed over the edge portion while the pulsed DC bias voltage is applied to the razor blade substrate. The strengthening coating layer may be a mixture of titanium and boron. The pulsed DC bias voltage may increase a hardness value of the portion of the coating, and/or be between 0 V and 600 V. The pulsed DC bias voltage may have a frequency between 50 kHz and 350 kHz.

The average proportion of boron and titanium atoms in the strengthening coating layer may be between 1.3:1 and 2.3:1, between 2.01:1 and 2.3:1, or between 1.3:1 and 1.99:1. A combined thickness of the razor blade substrate and at least a portion of the coating, e.g., only the strengthening coating layer, measured between the coating sides extending substantially orthogonal to a line bisecting the edge portion, at a distance of about 5 μm from a tip of the coating, may be between about 1.57 and 2.37 μm. It is foreseen that the coating may increase thickness of the razor blade substrate by 0.4 μm. A combined thickness of the blade substrate and at least a portion of the coating, e.g., only the strengthening coating layer, measured between coating sides extending substantially orthogonal to a line bisecting the edge portion, at a distance of about 20 μm from a tip of the coating, and may be between about 4.62 and 6.74 μm. The portion of the coating layer may be the strengthening coating layer. The hardness value may be between at or about 16 GPa and up to at or about 30 GPa.

The coating may include an interlayer formed between the razor blade substrate and the strengthening coating layer. The interlayer may be made of titanium. The coating may include a metal-containing overcoat layer formed over the strengthening coating layer. The overcoat layer may be made of chromium. The coating may include a polymer layer formed over the strengthening coating layer.

The aforementioned may be achieved in another aspect of the present inventive concept by providing a razor blade. The razor blade may include a razor blade substrate having an edge portion. The edge portion may have two substrate sides converging toward a substrate tip. The razor blade may include a coating formed on the edge portion. The coating may include a strengthening coating layer. The strengthening coating layer may have an altered configuration or crystal structure due to a deposition process performed during formation of the strengthening coating layer over the edge portion. The deposition process may include application of a pulsed DC bias voltage to the razor blade substrate during formation of the strengthening coating layer on the edge portion. The deposition process may increase a hardness value of the strengthening coating layer via application of bias voltage, which alters crystallinity of the strengthening coating layer. The bias voltage may be DC bias voltage or pulsed DC bias voltage. The hardness value may be between at or about 16 GPa and up to at or about 30 GPa.

The foregoing is intended to be illustrative and is not meant in a limiting sense. Many features of the embodiments may be employed with or without reference to other features of any of the embodiments. Additional aspects, advantages, and/or utilities of the present inventive concept will be set forth in part in the description that follows and, in part, will be apparent from the description, or may be learned by practice of the present inventive concept.

BRIEF DESCRIPTION OF THE DRAWINGS

The foregoing summary, as well as the following detailed description, will be better understood when read in conjunction with the appended drawings. For the purpose of illustration, there is shown in the drawings certain embodiments of the present disclosure. It should be understood, however, that the present inventive concept is not limited to the precise embodiments and features shown. The accompanying drawings, which are incorporated in and constitute a part of this specification, illustrate an implementation of apparatuses consistent with the present inventive concept and, together with the description, serve to explain advantages and principles consistent with the present inventive concept. On different figures, the same reference numerals designate the same or similar elements.

FIG. 9 is a schematic profile view of a blade tip in sectional view of the present inventive concept;

FIG. 10 is a schematic profile view of a blade tip in sectional view of the present inventive concept;

FIG. 11 is a schematic profile view of a blade tip in sectional view of the present inventive concept;

FIG. 12 is a schematic top view of a deposition apparatus of the present inventive concept for manufacturing of the razor blade;

FIG. 13 is a schematic side view of the apparatus illustrated by FIG. 12;

DETAILED DESCRIPTION

Figure 1:
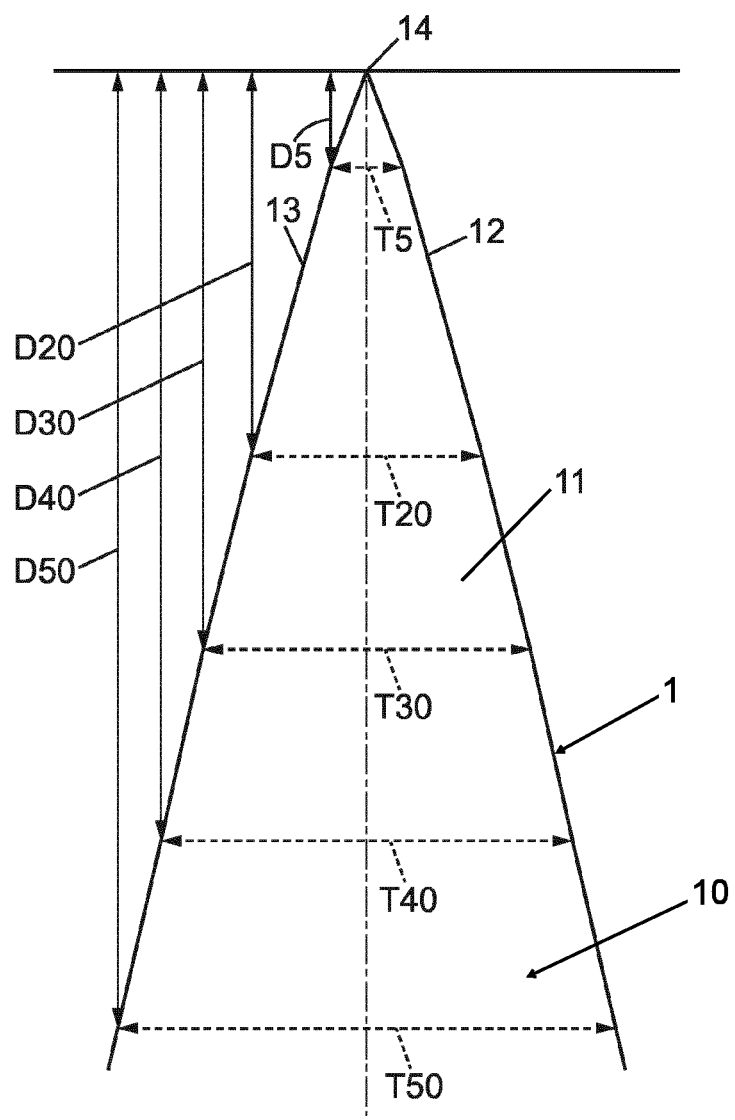
FIG. 1 is a schematic profile view of a blade tip of a razor blade of the present inventive concept.

It is to be understood that the present inventive concept is not limited in its application to the details of construction and to the embodiments of the components set forth in the following description or illustrated in the drawings. The figures and written description are provided to teach any person skilled in the art to make and use the inventions for which patent protection is sought. The present inventive concept is capable of other embodiments and of being practiced and carried out in various ways. Persons of skill in the art will appreciate that the development of an actual commercial embodiment incorporating aspects of the present inventive concept will require numerous implementations—specific decisions to achieve the developer's ultimate goal for the commercial embodiment. While these efforts may be complex and time-consuming, these efforts, nevertheless, would be a routine undertaking for those of skill in the art of having the benefit of this disclosure.

I. Terminology

The phraseology and terminology employed herein are for the purpose of description and should not be regarded as limiting. For example, the use of a singular term, such as, "a" is not intended as limiting of the number of items. Also, the use of relational terms such as, but not limited to, "top," "upper," "lower," "up," and "side," are used in the description for clarity in specific reference to the figures and are not intended to limit the scope of the present inventive concept or the appended claims. Further, it should be understood that any one of the features of the present inventive concept may be used separately or in combination with other features. Other systems, methods, features, and advantages of the present inventive concept will be, or become, apparent to one with skill in the art upon examination of the figures and the detailed description. It is intended that all such additional systems, methods, features, and advantages be included within this description, be within the scope of the present inventive concept, and be protected by the accompanying claims.

Further, any term of degree such as, but not limited to, "substantially," as used in the description and the appended claims, should be understood to include an exact, or a similar, but not exact configuration. For example, "a substantially orthogonal" means exactly orthogonal, i.e., extending at ninety degrees, or being closer to orthogonal than to parallel, e.g., extending at between forty-six and eighty-nine degrees. Similarly, the terms "about" or "approximately," as used in the description and the appended claims, should be understood to include the recited values or a value that is three times greater or one third of the recited values. For example, about 3 mm includes all values from 1 mm to 9 mm, and about 50 degrees includes all values from 16.6 degrees to 150 degrees.

Further, as the present inventive concept is susceptible to embodiments of many different forms, it is intended that the present disclosure be considered as an example of the principles of the present inventive concept and not intended to limit the present inventive concept to the specific embodiments shown and described. Any one of the features of the present inventive concept may be used separately or in combination with any other feature. References to the terms "embodiment," "embodiments," and/or the like in the description mean that the feature and/or features being referred to are included in, at least, one aspect of the description. Separate references to the terms "embodiment," "embodiments," and/or the like in the description do not necessarily refer to the same embodiment and are also not mutually exclusive unless so stated and/or except as will be readily apparent to those skilled in the art from the description. For example, a feature, structure, process, step, action, or the like described in one embodiment may also be included in other embodiments, but is not necessarily included. Thus, the present inventive concept may include a variety of combinations and/or integrations of the embodiments described herein. Additionally, all aspects of the present disclosure, as described herein, are not essential for its practice. Likewise, other systems, methods, features, and advantages of the present inventive concept will be, or become, apparent to one with skill in the art upon examination of the figures and the description. It is intended that all such additional systems, methods, features, and advantages be included within this description, be within the scope of the present inventive concept, and be encompassed by the claims.

Lastly, the terms "or" and "and/or," as used herein, are to be interpreted as inclusive or meaning any one or any combination. Therefore, "A, B or C" or "A, B and/or C" mean any of the following: "A," "B," "C"; "A and B"; "A and C"; "B and C"; "A, B and C." An exception to this definition will occur only when a combination of elements, functions, steps or acts are in some way inherently mutually exclusive.

II. General Architecture

Figure 2:
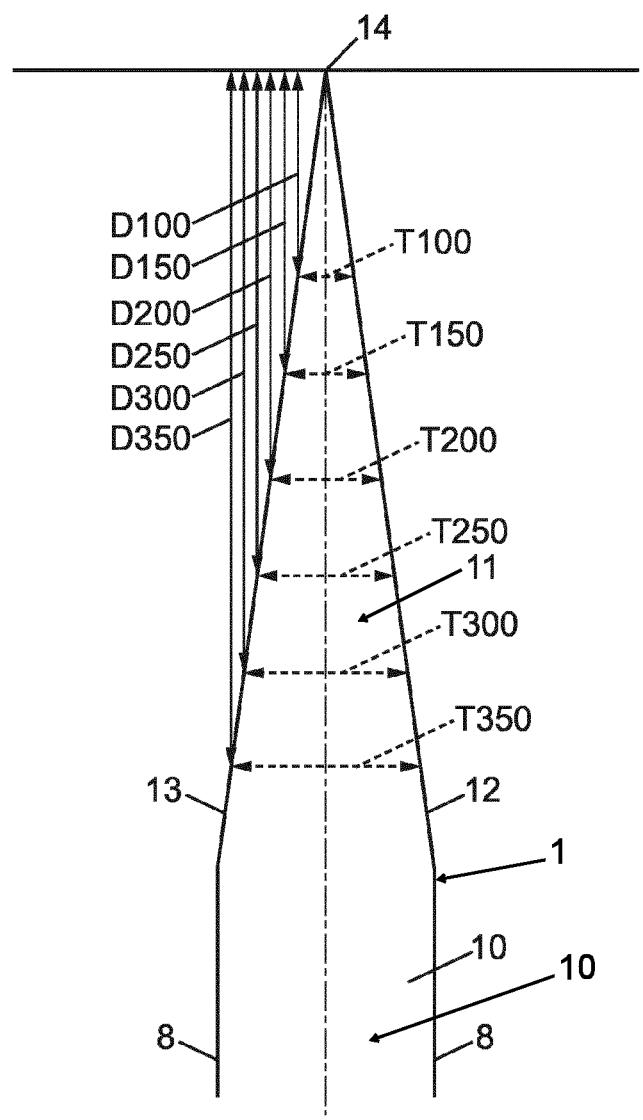
FIG. 2 is a schematic profile view of a blade edge substrate portion of a blade substrate of a razor blade of the present inventive concept.
Figure 3:
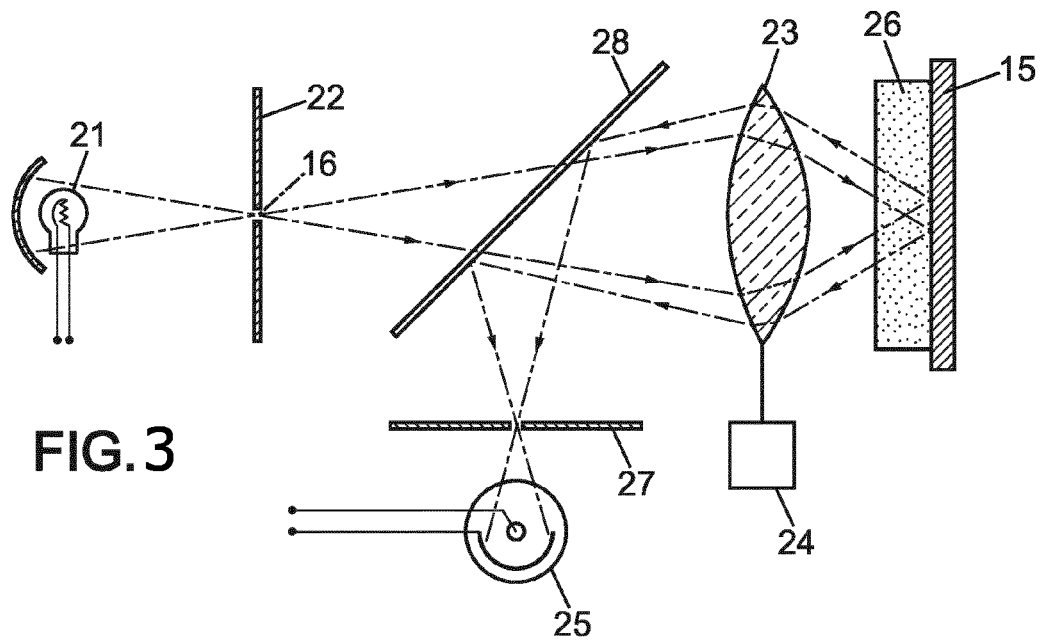
FIG. 3 is a schematic view of a confocal measurement setup.
Figure 4:
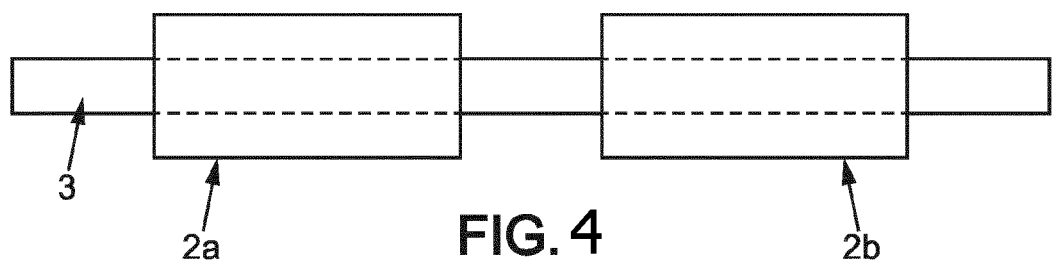
FIGS. 4 and 5 are schematic views of a grinding machine.
Figure 5:
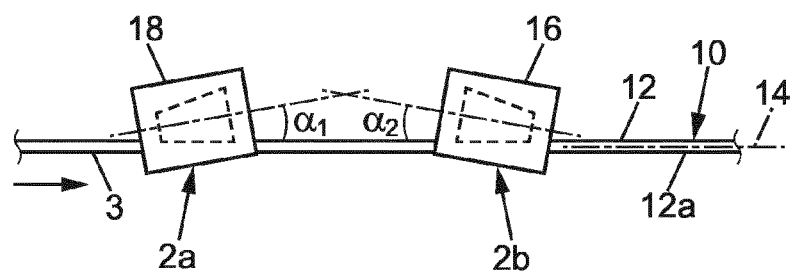

Turning to FIGS. 1-16, the present inventive concept is described in detail hereafter. Generally, a razor blade 1 includes a razor blade substrate 10 having a blade edge substrate portion 11, which is a sharpened portion of the blade substrate 10. FIGS. 1 and 2 illustrate the blade edge substrate portion 11 with tapered substrate sides 12, 13, which converge at a blade tip 14. The desired blade profile can be achieved by a grinding process that involves two, three, or four grinding stations. FIGS. 4 and 5 schematically illustrate a grinding installation having two stations 2a and 2b. The base material is a continuous metal strip 3. The metal strip 3 is made of raw material for the blade substrate 10, e.g., stainless steel, which has previously been subjected to a metallurgical treatment. For instance, the blade substrate 10 comprises mainly iron and, in weight: C: 0.48-0.72%; Si: 0.15-0.60%; Mn: 0.20-0.90%; Cr: 12.0-14.7%; and Mo: 1.20-1.40%. It is foreseen that other stainless steels may be used without deviating from the scope of the present inventive concept. For instance, other materials commonly used for razor blade substrate materials may be used.

The present inventive concept is also applicable to razor blades with a substrate of carbon steel. Another possible material includes ceramic. These materials are considered insofar as they are suitable for razor blade materials. The metal strip 3 is longer than a plurality of instances of the razor blade 1. For example, the metal strip 3 may be long enough to be used to form approximately 1000 or more instances of the razor blade 1. Before grinding, the metal strip 3 has, generally speaking, a rectangular cross-section. The height of the metal strip 3 can be slightly over the height of the razor blade 1, or slightly over the height of two of the razor blade 1, with a grinding process performed on both edges. The thickness of the metal strip 3 is the maximum thickness of the razor blade 1. The metal strip 3 may include through punches to facilitate transport or carrying of the metal strip 3 along the grinding installation during the grinding process, and/or may be used to facilitate future separation of individual instances of the razor blade 1 from the metal strip 3.

As the metal strip 3 moves along the grinding stations 2a, 2b, it is sequentially subjected to a rough grinding operation, a semi-finishing operation, and a finishing grinding operation. Depending on the number of stations involved, the rough grinding and semi-finishing operation may be performed separately or at the same station. Thereafter, the finishing grinding operation is performed at the grinding station 2a, 2b or at a different station. The grinding steps are performed continuously, in that the metal strip 3 is moved continuously through the grinding stations 2a, 2b without stopping movement of the metal strip 3.

When the rough grinding is performed separately, one or two of the grinding stations 2a, 2b are required. Each of the grinding stations 2a, 2b may utilize one or two abrading wheels positioned parallel with respect to the moving metal strip 3. The abrading wheels have uniform grit size along their length. They may also be full body or helically grooved along their length. The material of the abrading wheels may use resin-bonded or vitrified diamond, resin-bonded, or vitrified CBN (Cubic Boron Nitride), or resin-bonded or vitrified silicon carbide, aluminium oxide grains or a mixture of the aforementioned grains.

When rough grinding and semi-finishing operations are performed simultaneously, a single instance of the grinding stations 2a, 2b is required for these operations. In this case, the grinding station 2a, 2b includes two abrading wheels formed into spiral helixes or a sequence of straight discs with a profile. The rotational axes of these wheels may be parallel or positioned at an angle $\alpha_1$ with respect to the moving metal strip 3. The tilt angle ranges between about 0.5 degrees and about 2 degrees. The grit size of the wheels may also be uniform or progressively decreasing along their length towards the exit of the strip. The material of the abrading wheels might similarly use resin-bonded or vitrified diamond, resin-bonded or vitrified CBN or resin-bonded or vitrified silicon carbide, aluminum oxide grains or a mixture of the aforementioned grains.

The finishing operation requires a single instance of the grinding station 2a, 2b with two abrading wheels positioned at an angle with respect to the metal strip 3. The tilt angle $\alpha_2$ is reversed compared to the one used in the rough grinding operation. The tilted angle ranges between about 1 degree and about 5 degrees. The wheels form spiral helixes and are profiled. The abrasive material can be single grain or multi-grain material from the aforementioned CBN, silicon carbide, aluminum oxide or Diamond. The process is tuned to ensure that that the razor blade substrate portion 11 is symmetrical with a continuously tapering geometry toward the tip, as illustrated by FIG. 2.

For the measurement of the blade geometry, surface roughness and grinded angle, a confocal microscope is used. A typical example is illustrated by FIG. 3. The confocal microscope comprises a LED light source 21, a pinhole plate 22, an objective lens 23 with a piezo drive 24 and a CCD camera 25. The LED source 21 is focused through the pinhole plate 22 and the objective lens 23 on to a surface of the sample 26, which is operable to reflect the light. The reflected light is reduced by the pinhole of the pinhole plate 22 to that part which is in focus, and this falls on the CCD camera 25. The razor blade 1 may be oriented with its side angled, e.g., at forty-five degrees, with respect to the lens 23. The confocal microscope has a given measurement field of, for example 200 µm×200 µm. In the present example, a semi-transparent mirror 28 is positioned between the pinhole plate 22 and the lens 23 to direct the reflected light toward the CCD camera 25. In such case, another pinhole plate 27 is used for the filtering. However, in a variant, the semi-transparent mirror 28 could be positioned between the light source and the pinhole plate 22, which would permit use of only one pinhole plate for both the emitted light signal and the reflected light signal.

The piezo-drive 24 is operable to move the lens 23 along the light propagation axis to change the position of the focal point in depth. The focal plane can be changed while maintaining the dimensions of this measurement field. It is foreseen that, to extend the measurement field, e.g., in order to measure the blade edge substrate portion 11 further away from the blade tip 14, another measurement at another location may be performed, and the data resulting from all measurements can be stitched together or otherwise combined without deviating from the scope of the present inventive concept. The other side of the blade edge substrate portion 11 can then be measured simply by flipping the razor blade 1 to its other side.

According to one example, a confocal microscope based on the Confocal Multi Pinhole (CMP) technology could be used.

The pinhole plate 22 includes a plurality of holes arranged in a pattern. The movement of the pinhole plate 22 enables seamless scanning of the entire surface of the sample 26 within the image field and only the light from the focal plane reaches the CCD camera 25, with the intensity following the confocal curve. Thus, the confocal microscope is capable of high resolution in the nanometer range.

Also, other methods can be used to measure the thickness of the razor blade 1, for example measuring the cross-section of the razor blade 1 by a Scanning Electron Microscope (SEM). SEM is performed on a blade cross-section of the razor blade 1. It is foreseen, however, that SEM may not provide accurate measurement data because such requires preparation of a cross-section of the razor blade 1. The preparation of samples to be imaged is difficult, so that very few samples are imaged, and the results are likely to be non-statistically relevant.

Further, it is also possible to measure the thickness of the razor blade 1 by an interferometer. For this measurement, white light probes from one of a variety of sources, e.g., a halogen light source, an LED light source, a xenon light source, and/or the like, are coupled to an optical fiber in the controller unit and transmitted to an optical probe. The emitted light undergoes reflection from the razor blade 1 and is collected back into the optical probe, passes back up the fiber where it is collected into an analysis unit. The modulated signal is subjected to a fast Fourier transform to deliver a thickness measurement. However, since this measurement is based on light interference from the surface of the razor blade 1, the thickness measured by this method can be adversely affected.

In order to check the repeatability of the aforementioned measurement methods, measurements of the razor blade 1 using the same method were taken at different times by different operators. This process was performed for multiple ones of the razor blade 1. It was observed that confocal microscopy advantageously provides increased repeatability and reproducibility relative to the interferometry method.

To determine the correct thickness of the blade edge substrate portion 11, numerous measurements were taken with the aforementioned measurement methods on several blades. The average results of these measurements are detailed by Table 1.

TABLE 1

Comparison of thickness measuring methods.

| Distance from blade tip [µm] | Thickness of blade [µm] | |
| --- | --- | --- |
| | Interferometer | Confocal microscope |
| 4 | 1.55 | 1.79 |
| 5 | 1.88 | 2.16 |
| 8 | 2.84 | 3.16 |
| 16 | 5.22 | 5.59 |
| 20 | 6.40 | 6.74 |

As indicated by Table 1, the results of the interferometry measurement method are different than the results of the confocal microscopy method. Therefore, and also in view of the better reproducibility of the measurement using confocal microscopy as previously discussed, in the following, where dimensions are discussed, unless it is clear from the context that this is not the case, the dimensions are obtained by measurement using the above confocal microscopy method.

In addition to the blade edge substrate portion 11, the blade substrate 10 also includes a planar portion 8, wherein two opposite sides of the blade extend parallel to each other. As illustrated by FIG. 1, the sides 12, 13 of the blade edge substrate portion 11 connect to the planar portion 8 on one side thereof and taper to converge at the blade tip 14 of the cutting edge portion 11 of the blade on the other side thereof. The thickness of the blade edge substrate portion 11 can be measured by a confocal microscope. The shape of the razor blade 1 is profiled, meaning that the cross-section of the razor blade 1 is roughly identical along the length of the razor blade 1.

Razor blades with various geometries have been manufactured, measured, and tested for shaving performance. Manufacture includes not only a substrate sharpening by grinding, but also coatings as will be described hereafter. For the shaving tests of the present inventive concept, only the grinding step was modified in order to generate various substrate geometries, with the other processes performed without any modifications.

The tests determined that the thinness of the blade edge substrate portion 11 can be defined by checking the thickness of control points located 5 and 20 µm from the blade tip 14. Further, the strength of the blade tip 14 can be defined by checking the thickness of control points located 20 and 100 µm from the blade tip 14.

Further, the dimensions, as disclosed herein, are average dimensions along a length of the blade edge substrate portion 11. Due to the manufacturing process of the present inventive concept, the razor blade 1 does not have exactly the same profile along its whole length. Hence, each thickness value is an average value of various data obtained along the length, for example between 4 and 10 data.

After testing, it was determined that suitable shaving effects were obtained for blades having the following features. The cutting edge portion 11 of the blade has a thickness of T5 between 1.55 and 1.97 µm measured at a distance D5 of five µm from the tip. The cutting edge portion 11 of the blade has a thickness of T20 between 4.60 and 6.34 µm measured at a distance D20 of twenty µm from the tip. The cutting edge portion 11 of the blade has a thickness of T100 between 19.80 and 27.12 µm measured at a distance D100 of hundred µm from the tip. The aforementioned dimensions can be obtained through a dispersion of products manufactured using the same manufacturing process.

The razor blade 1 of the present inventive concept has a smooth profile in between and beyond, i.e., both from and away from the blade tip 14, these control points. The aforementioned suitable results had the following profiles as detailed by Table 2, although measured thickness geometry in other check points is not considered as relevant in terms of qualifying the quality of the product.

TABLE 2

Suitable blade profile parameters.

| Distance from blade tip [µm] | Lower thickness limit [µm] | Upper thickness limit [µm] |
| --- | --- | --- |
| 5 | 1.55 | 1.97 |
| 20 | 4.60 | 6.34 |
| 30 | 6.50 | 8.94 |
| 40 | 8.40 | 11.54 |
| 50 | 10.30 | 14.13 |
| 100 | 19.80 | 27.12 |
| 150 | 29.30 | 40.11 |
| 200 | 38.80 | 49.74 |
| 250 | 48.30 | 59.37 |
| 300 | 57.80 | 69.00 |
| 350 | 67.30 | 78.62 |

More preferably, the thickness of the blade edge substrate portion 11 of one of the aforementioned embodiment has the following thicknesses configuration. The thickness T5 is between 1.80 and 1.95 µm measured at a distance D5 of five µm from the blade tip 14. The thickness T20 is between 5.40 and 6.30 µm measured at a distance D20 twenty µm from the blade tip 14. The thickness of T100 is between 23.00 and 25.10 µm measured at a distance D100 hundred µm from the blade tip 14. In such cases, the thickness configuration is detailed by Table 3.

TABLE 3

Suitable blade profile parameters.

| Distance from blade tip [µm] | Lower thickness limit [µm] | Upper thickness limit [µm] |
| --- | --- | --- |
| 5 | 1.80 | 1.95 |
| 20 | 5.40 | 6.30 |
| 30 | 7.00 | 8.00 |
| 40 | 9.20 | 10.70 |
| 50 | 11.20 | 13.10 |
| 100 | 23.00 | 25.10 |
| 150 | 32.30 | 37.10 |
| 200 | 41.00 | 47.30 |
| 250 | 51.40 | 56.50 |
| 300 | 61.00 | 65.40 |
| 350 | 70.40 | 76.10 |

An example of a specific embodiment of the present inventive concept, has the following thickness configuration, as detailed by Table 4.

TABLE 4

Blade profile parameters according to an embodiment of the present inventive concept.

| Distance from blade tip [μm] | Thickness [μm] |
|---|---|
| 0 | 0.00 |
| 5 | 1.81 |
| 20 | 5.49 |
| 30 | 7.60 |
| 40 | 9.56 |
| 50 | 11.50 |
| 100 | 21.50 |
| 150 | 31.50 |
| 200 | 41.50 |
| 250 | 51.50 |
| 300 | 61.50 |
| 350 | 71.50 |

The blade thickness increase rate, i.e., slope, from the blade tip 14 up to a transition point between the sides 12, 13 and the portion 8 continuously increases/decreases, thereby allowing the blade tip 14 to easily penetrate hair of a user, which leads to greater comfort. The blade profile after the transition point (from 40 μm to 350 μm) is in a specific range of values to support a geometrically smooth transition from the first 40 μm to the unground part of the blade along the portion 8. In that region, the thickness increase rate is less than, or equal to, the increase rate at 40 μm.

The blade edge profile generated by the rough grinding stage, typically covering an area between 50-350 μm from the tip, determines the material removal rate of the finishing operation. Generally the finishing grinding stage is mainly called to smoothen out the excess surface roughness produced by rough grinding along with the final shaping of the blade edge profile. For optimal process efficiency, the material removal rate of finishing grinding wheel should be kept minimum but such that the induced surface roughness ranges between 0.005-0.040 μm. For example, the thickness of the blade profile can be described with the following mathematical formulas:

$$t = a \times (x^b) \quad \text{Formula A}$$

$$t = (c \times x) + d \quad \text{Formula B}$$

With respect to formulas (A) and (B), a and c are constants from an interval [0, 1], b is a constant from an interval [0.5, 1], d is a constant from an interval [0.5, 20], x is a distance from the blade tip 14 in micrometers (μm), and t is a thickness of the blade in micrometers (μm).

One or more formulas (A) can be applied one after the other to the portion of the blade extending from the blade tip 14 to the transition point, and one or more formulas (B) can be applied one after the other from the transition point to the unground portion of the blade.

For some embodiments, formula (A) describes the thickness of the cutting edge from 0 to 40 μm from the tip, e.g., with constants a=0.5 and b=0.8. Formula (B) describes the thickness of the cutting edge from 40 to 350 μm from the tip, with constants c=0.2 and d=1.5.

According to an embodiment of the present inventive concept, the thickness of the blade edge substrate portion 11 has the following thickness configuration as detailed by Table 5.

TABLE 5 blade profile parameters according to an embodiment of the present inventive concept.

| Distance from blade tip [μm] | Thickness [μm] |
|---|---|
| 5 | 1.82 |
| 20 | 5.82 |
| 30 | 8.33 |
| 40 | 10.84 |
| 50 | 13.35 |
| 100 | 25.90 |
| 150 | 38.45 |
| 200 | 47.38 |
| 250 | 56.25 |
| 300 | 65.13 |
| 350 | 74.00 |

Further, the thickness of the aforementioned blade profile can be described by the aforementioned formulas (A) and (B).

With respect to the aforementioned embodiment, formula (A) describes the thickness of the cutting edge from 0 to 20 μm, with constants a=0.47 and b=0.84. Formula (B) describes the thickness of the cutting edge from 20 to 150 μm, with constants c=0.251 and d=0.800. Further, formula (B) describes the thickness of the cutting edge from 150 to 350 μm, with constants c=0.1775 and d=11.8750.

According to an embodiment of the present inventive concept, the thickness of the blade edge substrate portion 11 has the following thickness configuration as detailed by Table 6.

TABLE 6 blade profile parameters according to an embodiment of the present inventive concept.

| Distance from blade tip [μm] | Thickness [μm] |
|---|---|
| 5 | 1.60 |
| 20 | 4.80 |
| 30 | 7.00 |
| 40 | 9.15 |
| 50 | 11.25 |
| 100 | 22.44 |
| 150 | 31.26 |
| 200 | 40.86 |
| 250 | 50.28 |
| 300 | 59.57 |
| 350 | 68.75 |

Further, the thickness of the aforementioned blade profile can be described by the aforementioned mentioned mathematical formula (A).

With respect to the aforementioned embodiment, formula (A) describes the thickness of the cutting edge from 0 to 20 μm, with constants a=0.45 and b=0.79. Formula (A) also describes the thickness of the cutting edge from 20 to 350 μm, with constants a=0.296 and b=0.93.

According to an embodiment of the present inventive concept, the thickness of the blade edge substrate portion 11 has the following thickness configuration, as detailed by Table 7.

TABLE 7 blade profile parameters according to an
embodiment of the present inventive concept.

| Distance from blade tip [μm] | Thickness [μm] |
| --- | --- |
| 5 | 1.96 |
| 20 | 5.93 |
| 30 | 8.54 |
| 40 | 11.06 |
| 50 | 13.52 |
| 100 | 25.24 |
| 150 | 36.35 |
| 200 | 47.10 |
| 250 | 56.10 |
| 300 | 65.10 |
| 350 | 74.10 |

Further, the thickness of the aforementioned blade profile can be described by the aforementioned mentioned mathematical formulas (A) and (B).

With respect to the aforementioned embodiment, formula (A) describes the thickness of the cutting edge from 0 to 20 μm, with constants a=0.54 and b=0.80. Formula (A) also describes the thickness of the cutting edge from 20 to 200 μm, with constants a=0.40 and b=0.90. Formula (B) describes the thickness of the cutting edge from 200 to 350 μm, with constants c=0.18 and d=11.10.

All of the aforementioned embodiments, which relate to the blade tip 14 as well as to the cutting edge of the razor of the present inventive concept can be described by formula (A) and/or formula (B), or with any one or more portions or other combinations of both formulas. The formulas (A) and (B) describe different sections measured from the blade tip 14.

The razor blade substrate 10 comprising the blade edge substrate portion 11 is made of stainless steel. A suitable stainless steel comprises mainly iron, and, in weight: C: 0.48-0.72%; Si: 0.15-0.60%; Mn: 0.20-0.90%; Cr: 12.0-14.7%; and Mo: 1.20-1.40%. It is foreseen that other steels, e.g., stainless steels, may be used in addition to or place of any one or more of the aforementioned materials without deviating from the scope of the present inventive concept.

In addition to the aforementioned manufacturing steps of the razor blade 1 of the present inventive concept, the following manufacturing steps can be executed to increase hardness of the razor blade 1 for shaving purposes. Specifically, one or more of the coating layers may be formed on the blade edge substrate portion 11 to improve the hardness of the blade edge substrate portion, thereby enhancing the quality of the shave by the user. The coating layers provide, among other things, reduction of wear of the blade edge substrate portion 11, improvement of the overall cutting properties, and increased lifespan and usability of the razor blade 1.

Figure 6:
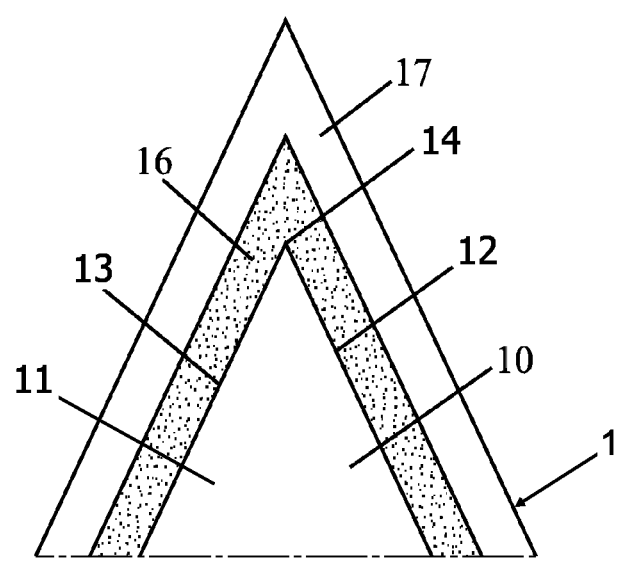
FIG. 6 is a schematic profile view of a blade tip in sectional view of the present inventive concept.

As illustrated by FIG. 6, the blade edge substrate portion 11 is coated with a strengthening coating layer 16 and a lubricating layer 17. The lubricating layer 17 is made of a polymer coating, e.g., a polyfluorocarbon polymer such as polytetrafluoroethylene (PTFE) or other fluoropolymer, and is operable to reduce friction during shaving. The strengthening coating layer 16 is used for its mechanical properties. The strengthening coating layer 16 is made of titanium and boron. More precisely, the strengthening coating layer 16 is made of titanium and boron with a low content of impurities. It is an objective of the present inventive concept, however, to minimize impurities contained within the materials as much as is economically feasible. The strengthening coating layer 16 is prepared with various proportions of titanium and boron within the layer. This means that there could be a mixture of titanium diboride ($TiB_2$) and/or other components comprising titanium and/or boron. The strengthening coating layer 16 comprises Ti-rich and/or B-rich areas. For purposes herein, "rich" is used in relation to the normal stoichiometric respective concentrations of Ti and B compared to $TiB_2$. The material which constitutes the coating layer 16 can be indicated as $TiB_x$. For example, the coating layer 16 has local variations of concentrations of these elements, having B-rich areas, where the atom ratio B:Ti is over 2, up to 2.3 (x comprised between 2.01 and 2.3), and Ti-rich areas, where the ratio B:Ti is below 2, down to 1.3 (x comprised between 1.3 and 1.99). The local variations can be randomly arranged in and throughout the strengthening coating layer 16. These proportions of titanium, boron, and titanium diboride can provide additional improvements for the overall coating of the blade edge substrate portion 11. So, for purposes herein, $TiB_x$ means the aforementioned coating.

It is foreseen that the strengthening coating layer 16 could include, in addition to or in place of the aforementioned materials, Cr, Cr—Pt mixtures, Cr—C mixtures, diamond, DLC, one or more nitrides, one or more carbides, one or more oxides, one or more borides, and/or any mixture or combination thereof without deviating from the scope of the present inventive concept.

Referring to FIG. 9, a coating layer configuration is shown, wherein the blade substrate 10 is covered by an interlayer 15 made of titanium which is covered by the strengthening coating layer 16 made of $TiB_x$. This layer configuration corresponds to a coating layer configuration on the blade edge substrate portion 11. It is foreseen that the interlayer 15 may be made of Cr or a Cr—Ti combination without deviating from the scope of the present inventive concept.

The manufacturing of the coated blades can be made by sputter deposition from Ti and $TiB_2$ targets. It is foreseen that one or more physical vapor deposition techniques or other processes may be used such as, but not limited to sputtering, unbalance magnetron sputtering, e-beam evaporation, pulsed laser deposition or cathodic arc deposition. As visible from FIGS. 12 and 13, instances of the blade substrate 10 are loaded on bayonets 31 in the depositing chamber 32, which comprises a Ti target 33, and two $TiB_2$ targets 34a, 34b. In some embodiments, the depositing chamber may also comprise a Cr target 35. For example, the four targets are provided as four corners of a square (seen from the top). For example, the two $TiB_2$ targets 34a, 34b face each other. Before the deposition, a sputter etching step can be carried out. The depositing chamber 32 is evacuated up to a base pressure of $10^{-5}$ Torr using vacuum means 36. Then Ar gas is inserted from an Ar gas source 37 into the chamber 32 up to a pressure of 8 mTorr ($8.10^{-3}$ Torr). By rotating the loaded bayonets 31 connected together through a common structure 38 at a constant speed of 6 rpm using a motor 39, all targets, and notably the Ti and $TiB_2$ targets 33, 34a, 34b are operated under DC current control at 0.2 Amps. A DC voltage of 200-600 V is applied on the stainless steel blades for 4 minutes. During the sputter etching step, impurities are removed from each one of the blade substrate 10 and the targets through bombardment of Argon ions.

For depositing the titanium interlayer 15, after the end of sputter etching step, the chamber pressure is adjusted to 3 mTorr. The Ti and $TiB_2$ target(s) are operated under DC current control at 3 and 0.2 Amps respectively while a DC voltage of 0-200 V is applied on the rotating blades. The current on the $TiB_2$ targets (and the same on the Cr target if present) is used to prevent elements from depositing on these targets. Adjusting the deposition time, a Ti layer of 10-100 nm, for example of 10-50 nm is deposited on the edge of the blade samples.

For depositing the TiB$_x$ strengthening layer 16, after the deposition of the Ti interlayer 15, the Cr, Ti and TiB$_2$ targets operate simultaneously, with the current on the Cr target set to 0.2 Amps, that on the Ti target(s) adjusted and the current on TiB$_2$ target(s) set to 3 Amps. The current on the Cr target is used to prevent elements from depositing on that target. Further, the ratio of currents applied on the Ti and TiB2 targets is adjusted as a function of the desired composition of the coating. A bias voltage is applied on the rotating blades during deposition of the strengthening layer 16. The application of the voltage affects crystallinity of the strengthening layer 16 and causes a hardness of the strengthening layer 16 to be increased up to about 30 GPa by altering or improving its nanocrystalline arrangement. The bias voltage may be a DC bias voltage or a pulsed DC bias voltage. The DC bias voltage applied to the rotating blades can be between 0 V and 600 V, and the pulsed DC bias voltage applied to the rotating blades can be between 0 V and 600 V, and is preferably 400 V. The frequency of the voltage applied to the rotating blades is between 50 kHz and 350 kHz, and is preferably 300 kHz, with a reverse time of 1.4 μsec and 4.0 μsec, and preferably 2 μsec. By controlling the deposition time, a TiB$_x$ layer of 20-150 nm is deposited on the Ti layer. Alternatively, a TiB$_x$ layer of 40-250 nm or a TiB$_x$ layer of 20-400 nm may be deposited on the Ti layer.

As further detailed hereafter, a metal-containing overcoat layer 20 can be formed over the strengthening layer 16. For instance, on top of the TiB$_x$ strengthening layer 16, the overcoat layer 20 of Cr with a width of 10-50 nm can be deposited, as depicted by FIG. 10. For this step, the coated blades can be moved to another sputter machine, or it can be carried out in the same machine, comprising a Cr target, as shown in FIGS. 12 and 13. The current on the Cr target(s) is set at 3 Amps and a bias voltage of 0-450 V is applied on the blades. If it is conducted in the same sputter machine, one may provide for protecting the non-operating target(s) from contamination from the operating target(s), and for preventing operation of non-operating targets at each step.

Figure 7:
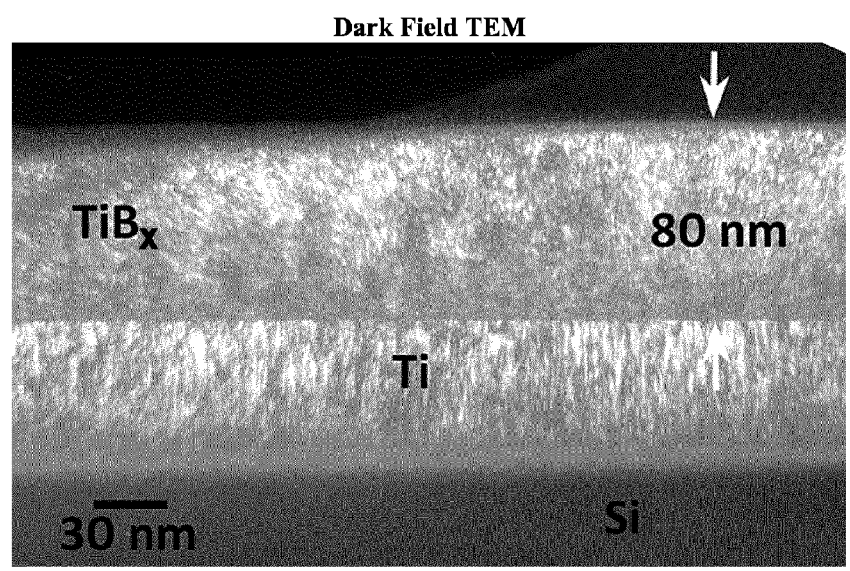
FIG. 7 is a dark field transmission electronic microscope view of a coated sample of the present inventive concept.

Referring to FIG. 7, the aforementioned coating layer configuration is shown wherein the blade edge substrate portion 11 is covered by a Ti interlayer 15. Further, the Ti interlayer 15 is covered by a TiB$_x$ strengthening layer 16. Moreover, layers 15 and 16 exhibit a nanocrystalline arrangement. In the TiB$_x$ layer, the atoms of the nanocrystals are arranged in a hexagonal lattice configuration. A layer exhibiting a nanocrystalline arrangement is also called a nanocrystalline layer. The nanocrystals can be defined as crystal structures having at least one, and notably all 3 main dimensions lower than 100 nm. The Ti nanocrystals form thin columns along the growth direction. The columns have diameters up to 10-12 nm.

The Ti layer 15 is covered by a TiB$_x$ strengthening layer 16 comprising TiB$_2$ nanocrystalline areas wherein the atoms of the nanocrystals are arranged in a hexagonal lattice configuration. The TiB$_x$ structure does not comprise any columnar structure, as visible in FIG. 7. Such a featureless structure has interesting properties for a razor blade strengthening coating.

FIG. 7 illustrates a layer structure on the blade edge substrate portion 11. The growth conditions and the applied bias voltage during formation of the TiB$_x$ strengthening layer 16 provide a hard structure with preferable mechanical properties for shaving, particularly compared to a TiB$_2$ columnar structure. The preferred growth conditions and the applied bias voltage on the substrate enable to grow the TiB$_x$ strengthening layer 16 comprising TiB$_2$ nanocrystalline areas wherein the atoms of the nanocrystals are arranged in a hexagonal lattice configuration.

Figure 8:
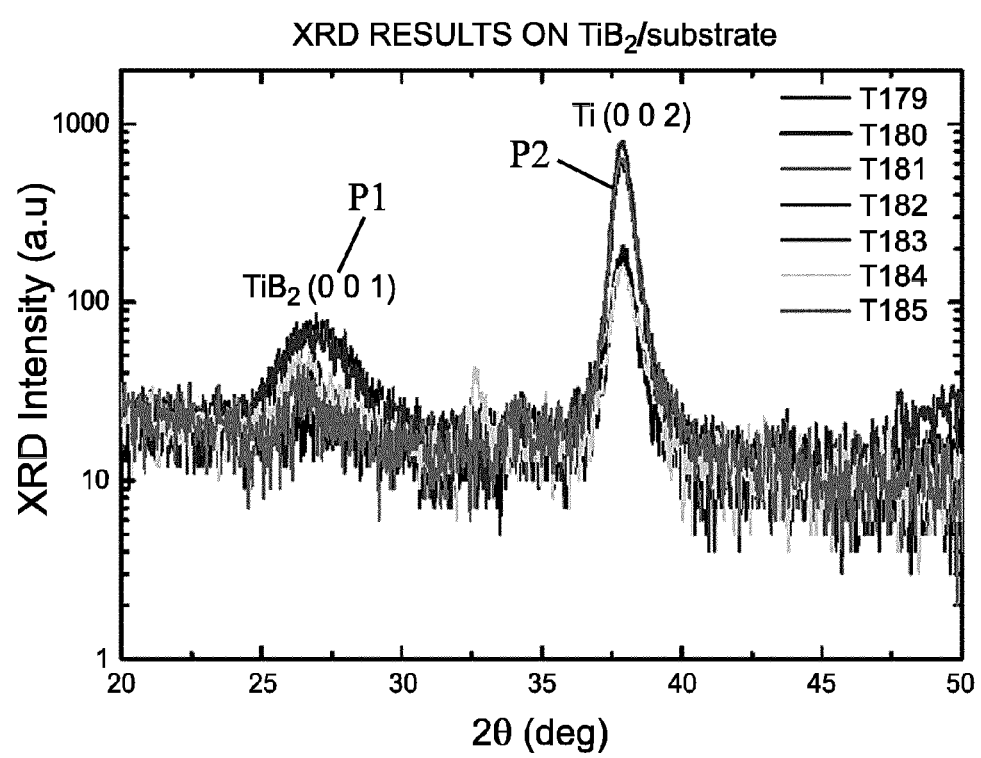
FIG. 8 shows X-ray diffraction spectrums of the Ti and $TiB_x$ layers deposited under various conditions on a substrate.

FIG. 8 illustrates an X-ray diffraction spectrum measurement for samples (T179-T185) covered by the aforementioned Ti interlayer 15 and TiB$_x$ strengthening layer 16, where deposition of the TiB$_x$ layer were performed under different deposition conditions. The peaks P1 refer to a TiB$_2$ (001) orientation in the TiB$_x$ layer. Different deposition conditions result in different (001) peaks P1. That is, the deposition conditions result in different structure of the hexagonal nanocrystalline arrangement of the TiB$_x$ layer. As depicted by FIG. 8, the peaks vary by intensity and broadening; however, the angular position of the peaks remains the same. The bias voltage, applied on the razor blade edge substrate portion 11, for achieving the aforementioned coatings is between 40V and 500V. The density of the TiB$_x$ nanocrystalline strengthening layer 16 cannot be measured on the razor blade edge substrate portion 11. The same coating deposited on a flat sample has a density which is between 3.9 g/cm$^3$ and 4.4 g/cm$^3$. An increased density is related to an increased strength of the layer.

As an example of thicknesses of the Ti interlayer 15 and the TiB$_x$ strengthening layer 16, 40 nm of Ti interlayer 15 and 60 nm of TiB$_x$ strengthening layer 16 can be considered. However, other dimensions of the thicknesses can be considered for both of the layers, wherein the overall thickness of Ti interlayer 15 and the TiB$_x$ strengthening layer 16 does not exceed 500 nm and, in some cases, does not exceed 150 nm.

The razor blade edge substrate portion 11 of the blade substrate 10 is covered by the strengthening layer 16 made of TiB$_x$. In an embodiment, the strengthening layer 16 may include the Ti interlayer 15. The strengthening layer 16 may be non-uniform or inconsistent with different areas of the strengthening layer 16 having differing proportions of titanium and boron atoms. For instance, in at least one area of the strengthening layer 16, the proportion of boron and titanium is comprised between y:1 and z:1, wherein y and z are comprised between 1.3 and 1.99, and y is lower than z, and/or wherein, in at least one area of the strengthening layer 16, the proportion of boron and titanium is comprised between u:1 and v:1, wherein u and v are comprised between 2.01 and 2.3 and u is lower than v. The average proportion of boron and titanium atoms in the strengthening layer 16 is between 1.3:1 and 2.3:1. Overall titanium-rich coatings would, on average, have x comprised between 1.3 and 1.99. The blade edge substrate portion 11 of the razor blade 1 might be coated by a strengthening coating comprising a sole strengthening layer 16, as previously described herein. This coating layer configuration is depicted by FIG. 10, where the blade edge substrate portion 11 is covered by a strengthening layer 16. The strengthening layer 16 is covered by the lubricating layer 17. The razor blade substrate comprising the razor blade edge is made of stainless steel. A suitable stainless steel comprises mainly iron, and, in weight: C: 0.48-0.72%; Si: 0.15-0.60%; Mn: 0.20-0.90%; Cr: 12.0-14.7%; and Mo: 1.20-1.40%. It is foreseen that other steels, e.g., stainless steels, may be used in addition to or place of any one or more of the aforementioned materials without deviating from the scope of the present inventive concept.

The coating layer configuration of the blade edge substrate portion 11 may include an interlayer 15 between the razor blade edge substrate portion 11 and the strengthening layer 16. This coating layer configuration is depicted by FIG. 9, where the blade edge substrate portion 11 is covered by an interlayer 15 which is covered by a strengthening layer 16. The interlayer 15 may be made of titanium. The interlayer 15 may be made of columnar nanocrystals, without adversely affecting the strengthening layer 16. The strengthening layer 16 is covered by the lubricating layer 17.

The thickness of the strengthening layer 16, measured normal to the substrate side, is between 20 and 150 nm. Alternatively, this thickness is between 40 and 250 nm. In general, this layer can be between 20 and 400 nm.

Furthermore, the strengthening coating might comprise a metal-containing overcoat layer 20 over the strengthening coating layer 16. For example, the metal-containing overcoat layer 20 is a layer of Chromium or Titanium. This coating layer configuration is depicted by FIG. 10, where the blade edge substrate portion 11 is covered by an interlayer 15 which is covered by a strengthening layer 16. The strengthening layer 16 is covered by the metal-containing overcoat layer 20 which is covered by the lubricating layer 17. The metal-containing overcoat layer 20 can further improve the overall hardness of the blade edge coating, and/or it can be used to provide adherence of the lubricating layer 17 to the strengthening coating layer 16.

The blade coatings of the present inventive concept can be used with razor blades with conventional geometry. However, it can also be used to coat razor blade substrates with new geometry, while still exhibiting correct shaving performance.

As illustrated by FIG. 11, a thickness T5 of the blade including the blade substrate 10 and the strengthening coating layer 16, excluding the lubricating layer 17, measured between sides of the strengthening coating layer orthogonal to a line bisecting the blade edge substrate portion 11, at a distance of 5 μm from a tip 19 of the strengthening coating layer, i.e., D5, can be for example between about 1.57 μm and about 2.37 μm, when measured using confocal microscopy. A thickness T20 of the blade including the blade substrate 10 and the strengthening coating layer 16, but excluding the lubricating layer 17, measured between sides of the strengthening coating layer orthogonal to a line bisecting the blade edge substrate portion 11, at a distance of 20 μm from the tip 19, i.e., D20, can be for example between about 4.62 μm and 6.74 μm. In such cases, the thickness configuration is detailed by Table 8.

TABLE 8

Suitable blade with coating profile parameters.

| Distance from coating tip [μm] | Lower thickness limit [μm] | Upper thickness limit [μm] |
|---|---|---|
| 5 | 1.57 | 2.37 |
| 20 | 4.62 | 6.74 |
| 30 | 6.52 | 9.34 |
| 40 | 8.42 | 11.94 |
| 50 | 10.32 | 14.53 |
| 100 | 19.82 | 27.52 |
| 150 | 29.32 | 40.51 |
| 200 | 38.82 | 50.14 |
| 250 | 48.32 | 59.77 |
| 300 | 57.82 | 69.4 |
| 350 | 67.32 | 79.02 |

Figure 14:
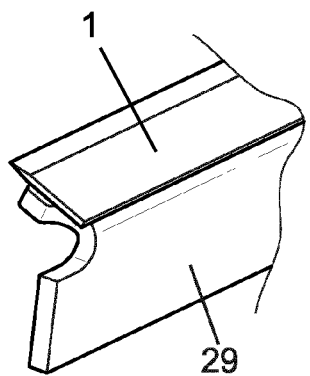
FIGS. 14 and 15 are cross-sectional view of two embodiments of a razor blade of the present inventive concept.
Figure 15:
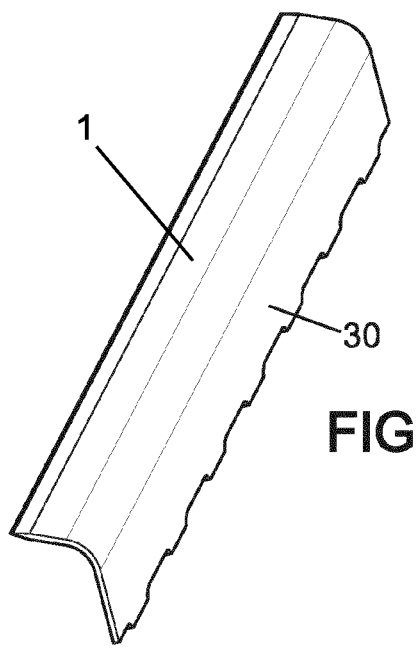
Figure 16:
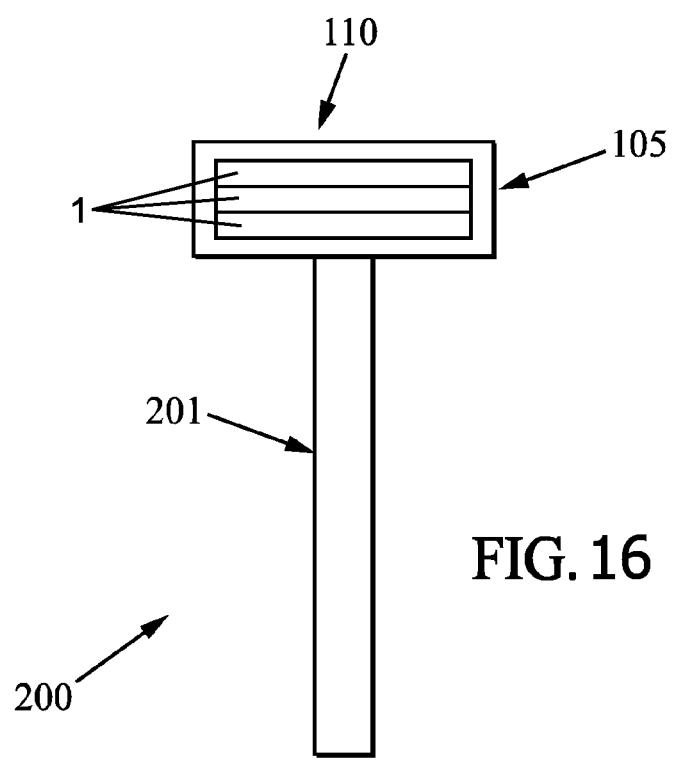
FIG. 16 is a schematic view of a shaver of the present inventive concept.

The blade substrate 10 can be affixed, e.g., welded, to a support 29, i.e., a metal support with an L-shaped cross-section, as illustrated by FIG. 14. Alternatively, the blade substrate 10 can be integrally formed with a bent blade, as illustrated by FIG. 15, where the aforementioned geometry applies between the blade tip 14 and the bent portion 30. The blade substrate 10 can be fixed or mechanically assembled to a razor head, and the razor head itself can be part of a razor. The blade substrate 10 can be movably mounted in a razor head, and mounted on springs which urge it toward a rest position. FIG. 16 illustrates multiple ones of the razor blade 1 mounted in a razor cartridge 105 to form a razor head 110 connected to a razor handle 201 to form a shaver 200 for shaving.

The razor blade 1 as coated via the aforementioned coatings were tested. A first test includes hardness measurements performed on coatings deposited on flat samples. Deposition of the $TiB_x$ coating, as defined above, on flat samples, revealed that the hardness of the nanocrystalline strengthening layer 16 reached up to 30 GPa, which is much more than the hardness obtained for standard current coatings deposited on the same flat samples. Greater hardness of the coating on razor blades can therefore be expected.

The razor blade 1 as coated via the aforementioned coatings were compared with standard production blades. The blades coated by Titanium, $TiB_x$, Chromium and PTFE layers, as described above, were compared to standard production blades coated by Chromium, CrC and PTFE layers. The substrate's material and profile, the total inorganic coating thickness and the thickness of the PTFE coating was the same for the blades according to the present invention and for the standard production blades. The specific test involves repeating cutting action of the blade on a moving felt, using a load cell for measuring the load on the blade for a series of 10 cuts. The test resulted in load ranges for the last ($10^{th}$) cut that were at least 39% lower than the load of blades from standard production. This result, per Table 9, shows that the blades with the above described $TiB_x$-containing coating preserve their cutting ability, shape and integrity, in a more effective manner during cutting action.

The damage imposed on the blade edge after 10 cuts during the above-described test was also evaluated with an optical microscope. The damage on the blade edge tip was quantified in terms of area of missing material (i.e. material that has been broken and removed from the edge) and area of intense deformation. $TiB_x$ coated blades resulted in a 90% decrease of the missing and/or intensely deformed material area as compared with blades from standard production. Table 9 illustrates the increased durability of the blades with the aforementioned $TiB_x$ coating. The increased durability could allow employing thinner blade edge profiles in razor blade products that would in turn be beneficial in the shaving performance of the product in terms of fluidity and overall evaluation.

TABLE 9

Cutting force results and edge damages for $TiB_x$ and conventional coatings.

| Razor blade sample | Force at $10_{th}$ cut (kg) | Area of damages (μm²) |
|---|---|---|
| Conventional coating | 3.19 | 51822 |
| $TiB_x$ | 1.95 | 6169 |

Regarding the aforementioned embodiment wherein an overall Ti-rich $TiB_x$ layer can be deposited by adjusting the current ratio of the Ti and $TiB_2$ targets during simultaneous operation of those targets, there appears to be other ways to obtain the aforementioned coating based on suitable choices of operating parameters such as current applied on the targets, blade bias voltage, displacement speed of the blades, chamber inner pressure. In particular, due to different deposition yields of Titanium and Boron from the $TiB_2$ targets, boron-rich areas can be obtained. The average proportion of boron and titanium atoms in the strengthening layer 16 is between 2.01:1 and 2.3:1.

The aforementioned parameters can be adjusted in order to deposit a $TiB_2$ coating. Although the resultant $TiB_2$ coating would not exhibit the composition of the original claim 1 which makes the coating particularly suitable as a razor blade coating such as exemplified above, it is contemplated that some $TiB_2$ coatings could be achieved that could also show some benefits as a razor blade strengthening coating. Some preliminary tests suggest that a razor blade with a specific profile as disclosed above could benefit from titanium- and boron-containing coatings for increased shaving performance. Some preliminary tests also suggest that a razor blade with a dense titanium- and boron-containing coating as discussed above could provide increased shaving performance.

Thickness data for the layers of the strengthening coating can be obtained by Auger Electron Spectroscopy Depth Profiling (AESDP). The measurement can be performed on the razor blade 1 itself, for example, after getting rid of the polymer coating or before applying the polymer coating.

Auger Electron Spectroscopy Depth Profiling is accomplished by exciting a blade edge surface with a finely focused electron beam, which causes Auger electrons to be emitted from the surface of the blade edge. These electrons relate to the material located approximately up to 5 nm deep from the surface. They are detected by use of an electron spectrometer consisting of an energy analyzer and an electron detector system. The measured energies of the Auger electrons can be correlated to corresponding elements of the analyzed material.

To record elemental depth profiles of selected elements, the sample surface is removed, for example sputtered away by bombardment with Ar+ ions. The removal rate (in nanometers/minute) of the sputtering process on this kind of coating is known from previous calibration measurements.

The profiling experiment is stopped when the Auger Electron Spectroscopy determines that the main material is the substrate material (most often stainless steel in the field of razor blades). Thus, knowing the overall thickness of the coating, it is possible to determine at which depth each of the measurements was performed.

The analyzed region for the survey spectra and depth profile can be located very close to the tip of the blade (5-10 μm away from the edge tip). Its size is of the order of magnitude 10 μm (for example a square patch of 10 μm×10 μm).

Prior to AES analysis, the blade samples are mounted on a sample holder and introduced into the ultrahigh vacuum chamber of the Auger Electron Spectrometer. Auger survey spectra are measured on the as received surface and after certain sputter times depending on profiling intensities, looking for the elements located in the thin film on the blade edge.

Depth profiling can be carried out by sputtering, for example by applying 3 keV Ar+ ion energy. Accurate depth scale quantification is possible by applying pre-calibrated sputter rates (i.e. material thickness removal as a function of time). These sputter rates are determined on reference standards with the same coatings as the analyzed samples. These samples were prepared by depositing on flat substrates thin films of identical composition, and deposited under the same conditions, as the layers on the blade edge and measuring their thickness by another profiling method in order to calibrate the AES method.

The other profiling method could be for example to place a mask on a sample to be coated and, further to deposition, to remove coating material where the mask was placed, so as to measure the height of the step between the remaining coated material and the substrate where the coating material was removed.

Alternatively, an approximated value for sputter rates can be determined from known sputter rates applied to the coating deposited on the certified reference material BCR-261T ($Ta_2O_5$(100 nm)/Ta-sheet).

Hence, according to one aspect of the present inventive concept, a method for determining a razor blade strengthening coating composition may be applied, wherein the following steps can be repeatedly executed: (i) measure the surface composition of the coating, and (ii) remove material from the coating at a given sputter removal rate until an underlying layer or the razor blade substrate is reached, and (iii) using sputter removal rate calibration data for the coating and the total strengthening coating thickness from another measurement method, attribute the measured surface compositions to a depth within the coating. This determination method can be applied for a $TiB_x$ coating, and may also be applied to other strengthening coatings as well.

The invention claimed is:

1. A razor blade comprising:
   a razor blade substrate having an edge portion, the edge portion having two substrate sides converging toward a substrate tip; and
   a coating formed on the edge portion, the coating including a strengthening coating layer and defining a coating tip,
   wherein,
      a first thickness of the edge portion with the coating measured at a first distance of five micrometers from the coating tip is between 1.57 and 2.37 micrometers,
      a second thickness of the edge portion with the coating measured at a second distance of twenty micrometers from the coating tip is between 4.62 and 6.74 micrometers,
      a third thickness of the edge portion with the coating measured at a third distance of hundred micrometers from the coating tip is between 19.82 and 27.52 micrometers, and
      a thickness of the edge portion with the coating measured at a distance of 300 micrometers from the coating tip is between 61.52 and 69.40 micrometers,
      a blade thickness increase rate is defined by a slope from the coating tip to a transition point between the two substrate sides and a planar portion of the substrate, wherein the blade thickness increase rate in a region between a distance from 40 micrometers to 300 micrometers from the tip is less than or equal to the blade thickness increase rate from the tip of the blade to a distance of 40 micrometers from the tip.

2. The razor blade of claim 1,
   wherein,
      the strengthening coating layer comprises a strengthening nanocrystalline layer made of a mixture of titanium and boron, with at least one of titanium-rich areas and boron-rich areas, where "rich" is used by reference to a stoichiometric TiB2 composition.

3. The razor blade of claim 1,
wherein,
the strengthening coating layer is made of a mixture of titanium and boron, with an average proportion of boron atoms and titanium atoms between 1.3:1 and 2.3:1.

4. The razor blade of claim 1,
wherein,
the strengthening coating layer includes a nanocrystalline layer comprising titanium diboride areas.

5. The razor blade of claim 1,
wherein,
the strengthening coating layer includes featureless crystallites having a characteristic dimension between 2 and 15 nanometers.

6. The razor blade of claim 1,
wherein,
the strengthening coating layer is deposited under a condition which, when applied to deposition on a sample, provide a coating having a density above 3.9 grams per cubic centimeter.

7. The razor blade of claim 1,
wherein,
the razor blade substrate is made of stainless steel.

8. The razor blade of claim 1,
wherein,
the coating includes an interlayer between the razor blade substrate and the strengthening coating layer.

9. The razor blade of claim 8,
wherein,
the interlayer is made of titanium or chromium.

10. The razor blade of claim 1,
wherein,
the coating includes a metal-containing overcoat layer over the strengthening coating layer.

11. The razor blade of claim 10,
wherein,
the overcoat layer is made of chromium or titanium.

12. The razor blade of claim 1,
wherein,
the coating only includes the strengthening coating layer.

13. The razor blade of claim 1,
wherein,
a first thickness of the strengthening coating layer, measured normal to a side of the razor blade substrate is between 20 and 400 nanometers.

14. The razor blade of claim 1,
wherein,
the coating includes a polymer coating on the strengthening coating layer.

15. The razor blade of claim 1,
wherein,
the strengthening layer includes a plurality of areas with different proportions of titanium atoms and boron atoms.

16. The razor blade of claim 15,
wherein,
the strengthening layer includes a first area of the plurality of areas with a proportion of boron atoms and titanium atoms between y:1 and z:1, wherein y and z are between 1.3 and 1.99, and y is lower than z, and
the strengthening layer includes a first area of the plurality of areas with a proportion of boron atoms and titanium atoms in at least one of the plurality of areas is between u:1 and v:1, wherein u and v are between 2.01 and 2.3 and u is lower than v.

17. A razor head having a cartridge with the razor blade of claim 1.

18. A razor having a handle secured to the razor head of claim 17.

19. The razor blade of claim 1,
wherein,
a fourth thickness of the edge portion with the coating at a fourth distance of thirty micrometers from the coating tip is between 6.52 and 9.34 micrometers.

20. The razor blade of claim 1,
wherein,
a fifth thickness of the edge portion with the coating at a fifth distance of forty micrometers from the coating tip is between 8.42 and 11.94 micrometers, and a sixth thickness of the edge portion with the coating at a sixth distance of fifty micrometers from the coating tip is between 10.32 and 14.53 micrometers.

21. The razor blade of claim 1, wherein the razor blade substrate is made of stainless steel, wherein the thickness of the razor blade substrate at the first distance of five micrometers from the substrate tip is between 1.55 and 1.97 micrometers.

22. The razor blade of claim 1, wherein a thickness of the edge portion with the coating measured at a distance of 350 micrometers from the coating tip is between 67.32 and 79.02 micrometers.

23. The razor blade of claim 1, wherein the thickness of the edge portion with the coating measured at the distance of 300 micrometers from the coating tip is between 65.15 and 69.40 micrometers.

* * * * *